United States Patent

Hassmann

(10) Patent No.: US 6,858,445 B2
(45) Date of Patent: Feb. 22, 2005

(54) METHOD FOR ADJUSTING THE OVERLAY OF TWO MASK PLANES IN A PHOTOLITHOGRAPHIC PROCESS FOR THE PRODUCTION OF AN INTEGRATED CIRCUIT

(75) Inventor: Jens Hassmann, Pirna (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/473,434

(22) PCT Filed: Mar. 12, 2002

(86) PCT No.: PCT/EP02/02704

§ 371 (c)(1),
(2), (4) Date: Sep. 29, 2003

(87) PCT Pub. No.: WO02/079880

PCT Pub. Date: Oct. 10, 2002

(65) Prior Publication Data

US 2004/0101769 A1 May 27, 2004

(30) Foreign Application Priority Data

Mar. 28, 2001 (DE) .......................................... 101 15 281

(51) Int. Cl.⁷ ............................................... H01L 21/00
(52) U.S. Cl. ...................... 438/7; 430/312; 257/E21.522
(58) Field of Search ................ 438/7, 312; 257/E21.522

(56) References Cited

U.S. PATENT DOCUMENTS

| 5,444,538 | A |   | 8/1995  | Pellegrini   | 356/401 |
| 5,451,479 | A |   | 9/1995  | Ishibashi    | 430/22  |
| 6,323,560 | B1 |  | 11/2001 | Narimatsu    | 257/798 |
| 6,404,498 | B1 | * | 6/2002 | Maeda et al. | 356/394 |
| 6,442,496 | B1 | * | 8/2002 | Pasadyn et al. | 702/83 |

FOREIGN PATENT DOCUMENTS

| DE | 44 14 369 A1 | 10/1994 | ......... H01L/21/308 |
| DE | 196 25 669 A1 | 1/1997 | ............. G03F/9/00 |

OTHER PUBLICATIONS

Progler, Christopher, et al., *Method to Budget and Optimize Total Device Overlay*, Partt of the SPIE Conference on Optical Microlithography XII, Santa Clara, California, Mar. 1999, pp. 193–207.

Armitage, Jr., John D., *Analysis of Overlay Distortion Patterns*, SPIE vol. 921, Integrated Circuit Metrology, Inspection, and Process Control II (1988), pp. 207–222.

* cited by examiner

*Primary Examiner*—George Fourson
*Assistant Examiner*—Thanh V Pham
(74) *Attorney, Agent, or Firm*—Brinks Hofer Gilson & Lione

(57) ABSTRACT

The present invention provides a method for optimizing the overlay adjustment of two mask planes in a photolithographic process for the production of an integrated circuit having the following steps: provision of a substrate (S) with at least one first mask plane (ME), which has been patterned by exposure of a first mask using a first exposure device; orientation of a second mask (M), which is provided for the patterning of a second mask plane using a second exposure device, with respect to the first mask plane (ME); measurement of the overlay between the first mask plane (ME) and the second mask (M); analysis of the measured overlay taking account of error data (FAD, FXD, FBD, FYD) provided, in advance regarding errors (FA, FX, FB, FY) of the first and second masks and/or errors of the first and second exposure devices; carrying out of a correction of the orientation of the second mask (M) depending on the result of the analysis.

4 Claims, 3 Drawing Sheets

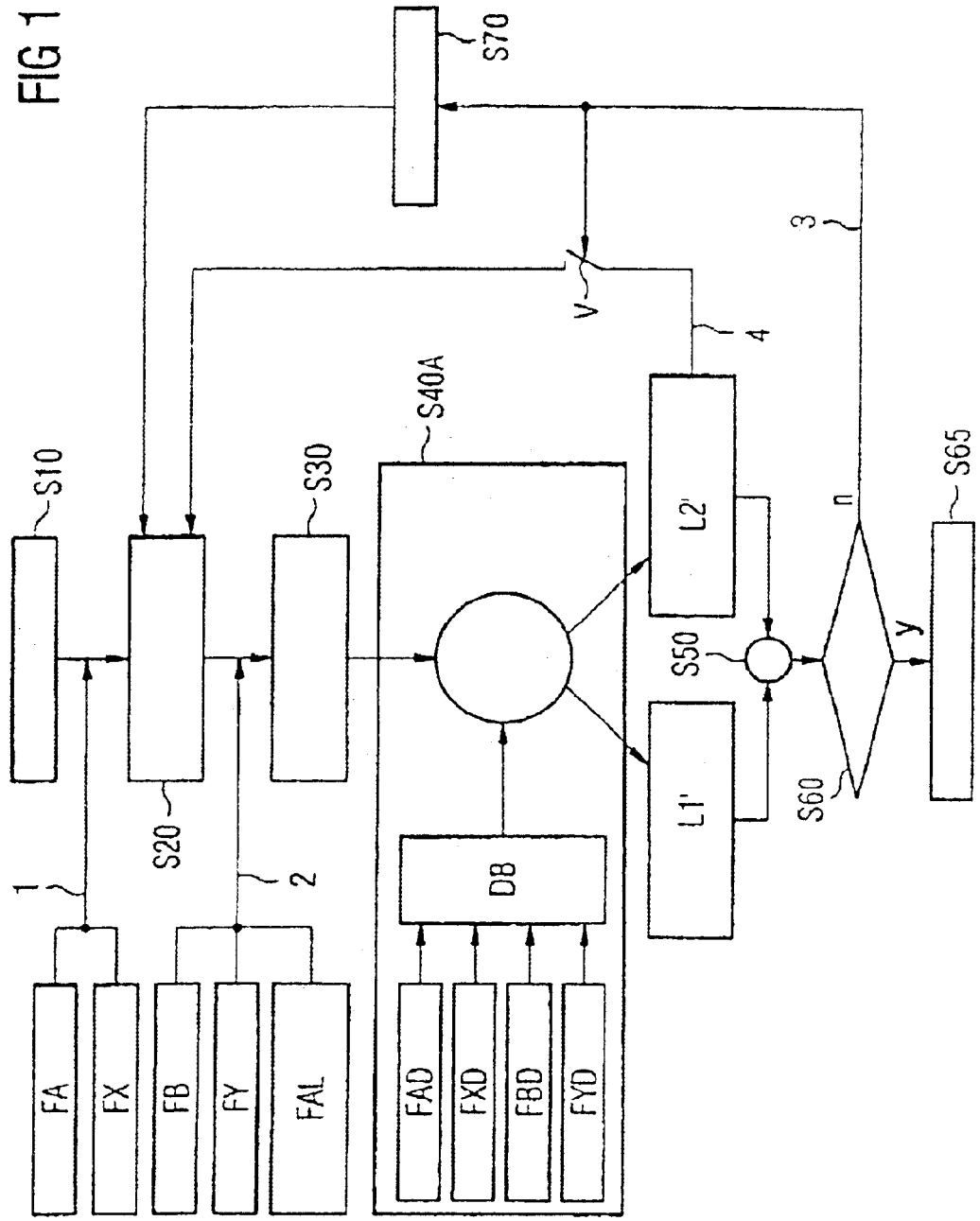

METHOD FOR ADJUSTING THE OVERLAY OF TWO MASK PLANES IN A PHOTOLITHOGRAPHIC PROCESS FOR THE PRODUCTION OF AN INTEGRATED CIRCUIT

The present invention relates to a method for optimizing the overlay adjustment of two mask planes in a photolithographic process for the production of an integrated circuit.

The production of integrated circuits in semiconductor technology is usually effected in a plurality of mask planes which have to be oriented as congruently as possible with respect to one another. The requirements made of the overlay accuracy increase as the integration density increases.

In order to be able to make statements that are as unambiguous as possible regarding the overlay quality and to be able to carry out corresponding corrections, systematic error sources should as far as possible be known and thus able to be eliminated. The error sources occurring in the lithography with regard to overlay accuracy are, inter alia, the tolerances of the photo masks used in the individual lithography steps, and the errors of the exposure devices used, such as e.g. distortion of projection optics.

In known methods for adjusting the overlay of two mask planes, these error sources have not directly been taken into account heretofore. Although mask tolerances and lens distortions have been specified and taken into account for the combination of exposure devices, they have not yet been concomitantly incorporated directly into the evaluation of overlay measurements.

Figure 2A:
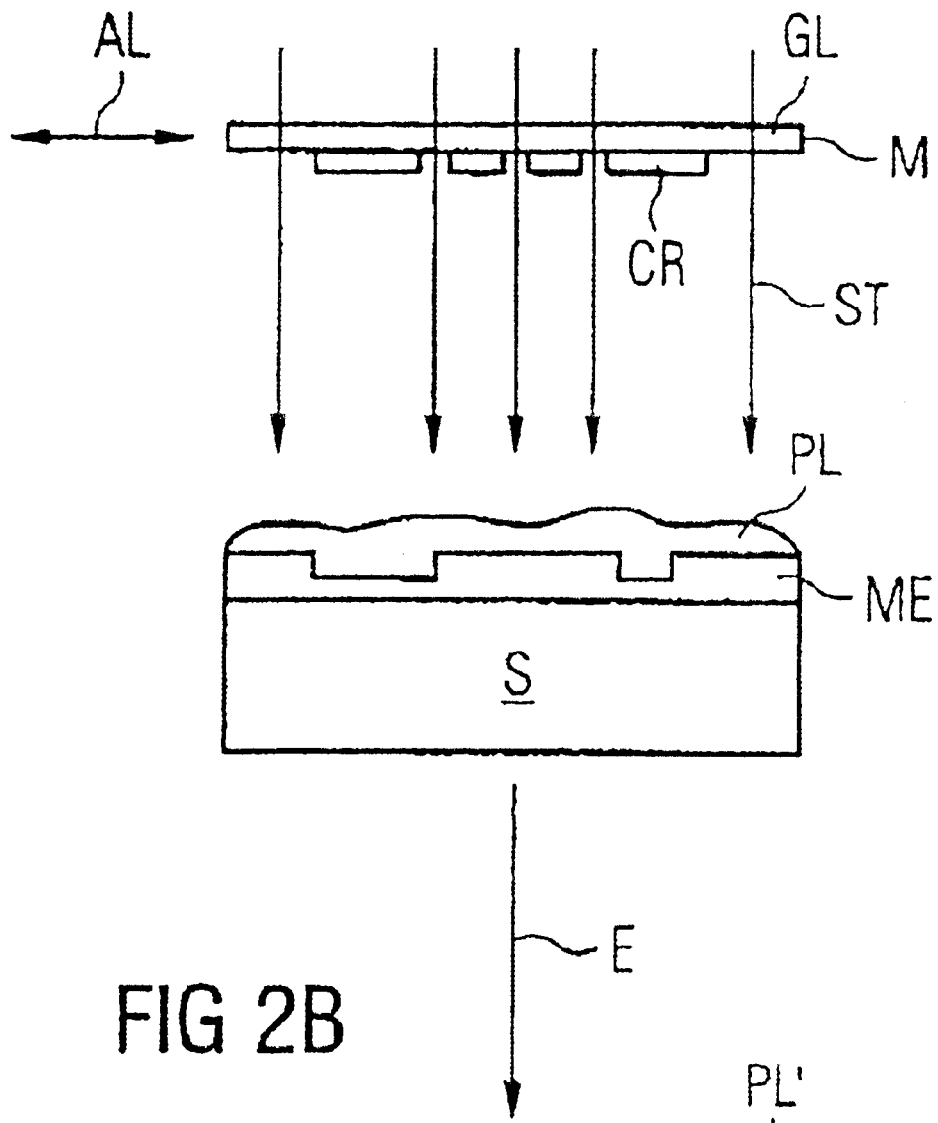

FIGS. 2a, b show a diagrammatic illustration of a photolithographic process for the production of an integrated circuit.

In accordance with FIG. 2a, a substrate S is provided, which carries a first mask plane ME, which has been patterned by exposure of a first mask (not shown) using a first exposure device. After that (and further process steps required for the fabrication of integrated components), a photoresist layer PL is applied to the first mask plane. A second mask M is then oriented AL with respect to the first mask plane ME using reference marks provided in the substrate, in which case the second mask M, for the patterning of a second mask plane, may be provided with a second exposure device for production-dictated reasons.

The masks usually comprise a transparent glass carrier, GL having a patterned chromium layer CL provided on one of its sides. Light beams ST can pass through the mask at the locations at which no chromium is provided, and thus expose the photoresist PL and thus transfer the mask structure to the photoresist PL.

Figure 2B:
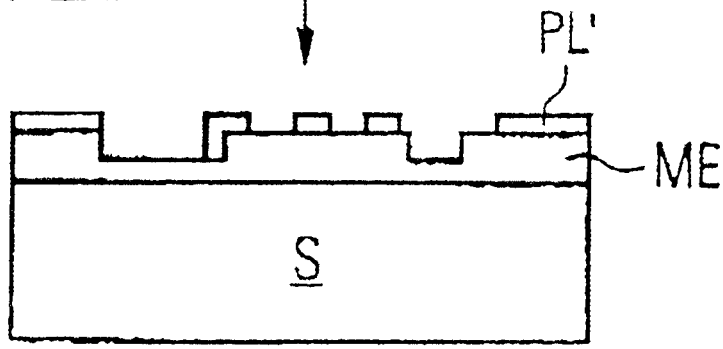

In accordance with FIG. 2b, the exposure by the light beams ST is followed by a development process E, in which, in the case of positive resist, the exposed locations are dissolved from the photoresist layer PL, which leads to a patterned photoresist layer PL'. A subsequent overlay measurement of the plane PL' with respect to the plane ME yields a statement concerning the quality of the overlay accuracy of the two planes.

Figure 3:
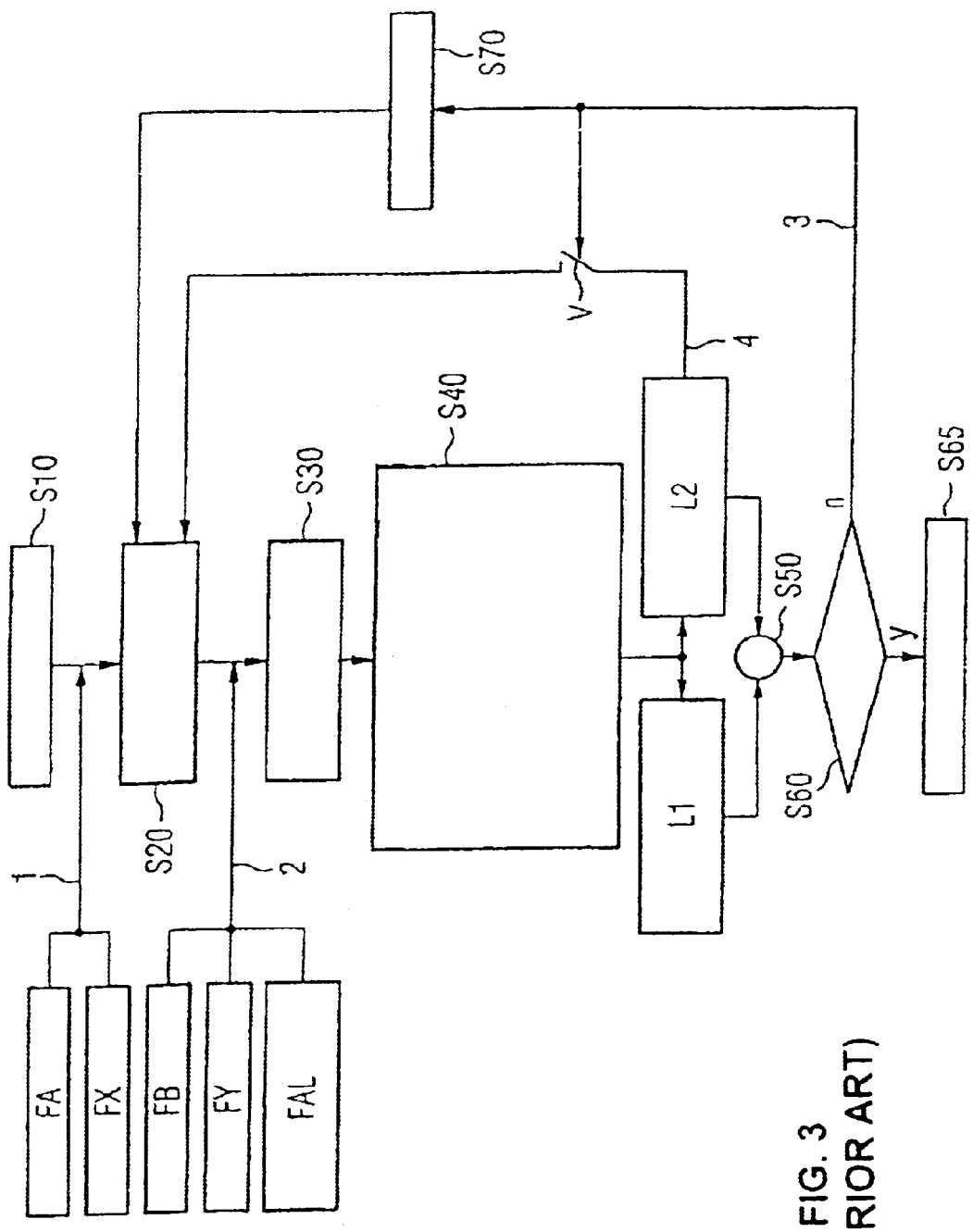

FIG. 3 shows the essential steps of a known method for adjusting the overlay of two mask planes in a photolithographic process with feedback loop for the production of an integrated circuit.

The known method begins with step S10, in which a substrate S with a first mask plane ME is provided. As shown by the arrow 1, error factors for the later overlay are already present here, namely mask errors FA of a first mask which has been used to create the first mask plane ME, and also exposure errors FX originating from the first exposure device which was used to expose the first mask.

In step S20 (lithography process), the second mask M is then oriented with respect to the first mask plane ME. In this case, further error variables occur for the overlay, this being indicated by the arrow 2. In particular, these are the mask errors FB of the second mask M, the exposure errors FY of the second exposure device used for exposing the mask M, and also process- and installation-dictated orientation errors FAL of mask M with respect to the substrate.

The higher-order components of the mask errors FA and FB and of the exposure errors FX and FY (distortions) are generally regarded as noncorrectable errors for the exposure device.

The overlay between the first mask plane ME and the second mask M is then measured in the subsequent step S30. This is done by customary methods, such as e.g. box-in-box measurements at selected locations on the processed substrate.

The measurement result of the overlay measurement from step S30 is subsequently analyzed in step S40. Such an analysis is usually carried out with the aid of a software program which analyzes digitized measurement data in accordance with a predetermined algorithm. The aim of the evaluation is, on the one hand, to assess the overlay accuracy and, on the other hand, to predict the success of a possibly required renewed processing of the substrate including the correction parameters required for this.

It is disadvantageous that the known overlay analysis does not make it possible to distinguish between different error influences of the errors FA, FX, FB, FY, FAL or other errors. Consequently, a differentiation into a list for exposure installations of uncorrectable errors L1, such as e.g. randomly distributed error images (distortions), and a list of correctable errors L2, such as e.g. rotation, displacement or the like, can be realized only in a highly global fashion.

Using the lists L1, L2, an assessment according to predetermined criteria of the overlay analysis is then performed in step S50. The result of the assessment is compared with a predetermined specification in step S60. If the comparison in step S60 reveals that the overlay lies within the specification limits and the overlay element of the lithography process is thus regarded as successful, then it is possible to continue with the further processing of the substrate in step S65.

If the answer in step S60 is no, then a postprocessing is initiated in step S70, this being indicated by the arrow 3. In particular, such a postprocessing causes the correctable errors in accordance with the list L2 to be available in the repetition of step S20, this being indicated by the closing of the connection V. In other words, it is possible to take account of correctable errors, such as e.g. rotations or displacements, identified when step S20 is carried out anew.

It is an object of the present invention to provide a method for adjusting the overlay of two mask planes in a photolithographic process for the production of an integrated circuit whereby a better error analysis and subsequent error correction of the overlay are possible.

According to the invention, this object is achieved by means of the method for adjusting the overlay of two mask planes in a photolithographic process for the production of an integrated circuit as specified in claim 1.

The idea on which the present invention is based consists in the fact that the masks and/or the exposure devices are measured in advance using a reference grid and the data obtained therefrom are stored in a database of noncorrectable errors. These error data are concomitantly taken into account later during the overlay analysis, which enables a simpler separation of noncorrectable and correctable errors. This in turn simplifies the assessment of whether a postprocessing is expedient, and accordingly contributes to avoiding hopeless postprocessing loops. Consequently, the method according to the invention ultimately helps to save process time and installation capacity. Furthermore, in the feedback loop, only actually correctable parameters are made available to the exposure device without superposed noncorrectable components or overcompensation, which contributes to the improvement of the overlay result.

Advantageous developments and improvements of the invention's method for adjusting the overlay of two mask planes in a photolithographic process for the production of an integrated circuit can be found in the subclaims.

In accordance with one preferred development, the analysis provides a division into correctable and noncorrectable errors.

In accordance with a further preferred development, the photolithographic process is interrupted if either the number of correction steps exceeds a predetermined value or the predicted result is assessed as insufficient.

In accordance with a further preferred development, the result of the analysis is compared with a predetermined specification and the correction of the orientation of the second mask is carried out depending on the result of the comparison.

In accordance with a further preferred development, the analysis provides a division into correctable and noncorrectable errors and the photolithographic process is interrupted if the result of the comparison lies outside the specification and, at the same time, only noncorrectable errors are present.

In accordance with a further preferred development, the error data regarding errors of the first and second masks and/or errors of the first and second exposure devices are obtained by a measurement by means of a reference grid.

In accordance with a further preferred development, the error data are stored in a database and concomitantly used for the analysis of the overlay result.

An exemplary embodiment of the invention is illustrated in the drawings and explained in more detail in the description below.

In the figures:

FIG. 1 shows the essential steps of a method for adjusting the overlay of two mask planes in a photolithographic process for the production of an integrated circuit as an embodiment of the present invention;

FIGS. 2a, b show a diagrammatic illustration of a photolithographic process for the production of an integrated circuit; and FIG. 3 shows the essential steps of a known method for adjusting the overlay of two mask planes in a photolithographic process for the production of an integrated circuit.

In the figures, identical reference symbols designate identical or functionally identical constituents.

FIG. 1 shows the essential steps of a method, for adjusting the overlay of two mask planes in a photolithographic process for the production of an integrated circuit as an embodiment of the present invention.

In accordance with FIG. 1, steps S10 to S30 are effected in the same way as in the known method according to FIG. 3.

In particular, step S10 effects provision of the substrate S with the first mask plane ME, which has been patterned by exposure of the first mask using the first exposure device.

In step S20, a second mask M, provided for the patterning of the second mask plane using the second exposure device, is then oriented with respect to the first mask plane ME.

Finally, in step S30, the overlay between the first mask plane ME and second mask M is measured.

The subsequent step S40A differs significantly from the known step S40 in accordance with FIG. 3 because it makes it possible to distinguish between different error influences of the errors FA, FX, FB, FY, FAL.

This is because, in this embodiment, error data FAD, FXD, FBD, FYD regarding the aforementioned errors FA, FB of the first and second masks and errors FX, FY of the first and second exposure devices have been provided in advance.

These error data FAD, FXD, FBD, FYD were obtained by a measurement of the first and second masks and of the imagings of the first and second exposure devices by means of a reference grid (registration). The error data FAD, FXD, FBD, FYD are subsequently stored in a database DB.

The measurement of mask errors using a reference grid can be carried out very simply e.g. directly after mask production. By way of example, a file containing said error data can be added when each mask is supplied, said file being stored in the database of the overlay analysis software.

The distortion of the lens systems of the exposure devices can also be determined using relatively simple means, namely either by means of direct measurement in a calibrated measuring device or likewise with respect to an arbitrarily definable reference grid which expediently corresponds to the reference grid used for determining the mask errors.

Reference disks for determining the distortion of the lens systems of the exposure devices are expediently measured using the same measuring device by which the masks used are likewise characterized. A common reference system is thus available as a basis.

If the data of all these measurements are set to a common reference, such as the database DB, and conditioned accordingly, then they can be used in the evaluation of the overlay measurement in terms of software. Optimal correction parameters can thus be prescribed, if necessary.

Therefore, these error data FAD, FXD, FBD, FYD provided in advance are taken into account during the analysis of the measured overlay in step S40A, which has the effect that the relevant error sources can be separated. Accordingly, in this embodiment, a division into correctable errors in list L2' and noncorrectable errors in list L1' is possible in a significantly simpler and more precise manner since the systematic errors can be separated.

Using the lists L1', L2', an assessment according to predetermined criteria of the overlay analysis is then performed in step S50, as in the known method. The result of the assessment is compared with a predetermined specification in step S60.

If the comparison in step S60 reveals that the overlay lies within the specification limits, then it is possible to continue with the planned further processing in step S65. If the answer in step S60 is no, then a postprocessing is initiated in step S70, this being indicated by the arrow 3. In particular, such a postprocessing causes the correctable errors in accordance with the list L2' to be available in the repetition of step S20 as a result of the indicated closing of the connection V. In other words, it is possible to eliminate correctable errors, such as e.g. rotations or displacements, identified when step S20 is carried out anew.

Although the present invention has been described above on the basis of preferred exemplary embodiments, it is not restricted thereto, but rather can be modified in diverse ways.

In particular, the photolithographic process can be interrupted if either the number of correction steps deemed to be necessary exceeds a predetermined value or the overlay result to be achieved cannot be brought into accord with the predetermined specification even after postprocessing has been effected with the calculated correction values.

Moreover, the feedback loop of the photolithographic process can be interrupted if the result of the comparison lies outside the specification and, at the same time, only noncorrectable errors are present.

Moreover, further parameters can be systematically detected and taken into account in step S40A, such as e.g. process parameters or the like.

What is claimed is:

1. A method for adjusting the overlay of two mask planes in a photolithographic process for the production of an integrated circuit, the method comprising the steps of:

providing a substrate with at least one first mask plane, which has been patterned by exposure of a first mask using a first exposure device;

orientating a second mask, which is provided for patterning a second mask plane using a second exposure device, with respect to the first mask plane;

measuring an overlay between the first mask plane and the second mask plane;

providing error data, which are stored in a database, regarding errors of the first and second masks and/or errors of the first and second exposure devices by a measurement by means of a common reference grid;

analyzing the measured overlay taking account of the error data provided in advance regarding the errors of the first and second masks and/or errors of the first and second exposure devices;

comparing a result of said analyzing with a predetermined specification; and performing a correction step for correcting the orientation of the second mask depending on a result of said comparing.

2. The method of claim 1, wherein said analyzing provides a division into correctable and noncorrectable errors.

3. The method of claim 2, further comprising interrupting the photolithographic process if the result of said comparing lies outside the specification and, at the same time, only noncorrectable errors are present.

4. The method of claim 1, further comprising interrupting the photolithographic process if a number of correction steps exceeds a predetermined value or a predicted result is assessed as insufficient.

* * * * *